United States Patent [19]

Miyakoshi et al.

[11] Patent Number: 4,812,815
[45] Date of Patent: Mar. 14, 1989

[54] DIGITAL-TO-ANALOG CONVERTER SYSTEM

[75] Inventors: Kazumitsu Miyakoshi, Yamatokoriyama; Mitsuyoshi Nakaya, Nara, both of Japan

[73] Assignee: Sharp Kabushiki Kaisha, Osaka, Japan

[21] Appl. No.: 923,163

[22] Filed: Oct. 24, 1986

[30] Foreign Application Priority Data

Dec. 25, 1985 [JP] Japan .............................. 60-298451
Apr. 21, 1986 [JP] Japan .............................. 61-92960
May 26, 1986 [JP] Japan .............................. 61-123034

[51] Int. Cl.$^4$ ............................................ H03M 1/00
[52] U.S. Cl. ................................... 455/612; 375/25; 341/144
[58] Field of Search .................. 340/347 DA; 375/23, 375/25, 22, 29, 30

[56] References Cited

U.S. PATENT DOCUMENTS 4,209,773 6/1980 Everard ..................... 340/347 DA
4,399,564 8/1983 Cowen ............................. 375/23
4,484,178 11/1984 Lovgren et al. ............ 340/347 DA

*Primary Examiner*—William M. Shoop, Jr.
*Assistant Examiner*—Richard K. Blum
*Attorney, Agent, or Firm*—Birch, Stewart, Kolasch & Birch

[57] ABSTRACT

A D/A converter system for converting digital signal to analog signal includes a circuit for converting digital signal such as PCM signal to pulse density modulation signal, and an analog low-pass filter for converting the pulse density modulation signal to analog signal by removing noise from the pulse density modulation signal.

6 Claims, 12 Drawing Sheets

FIG. 1
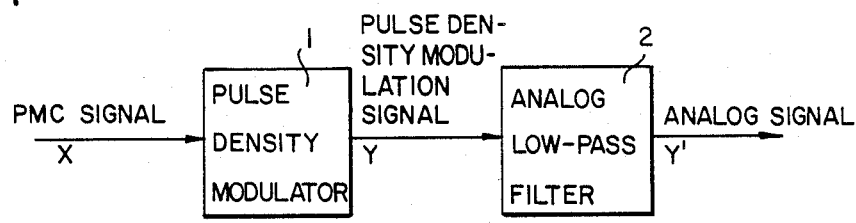
FIG. 2
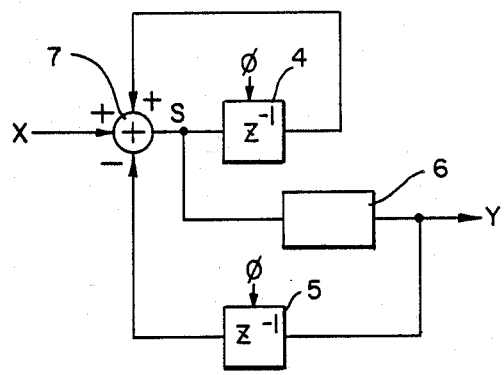
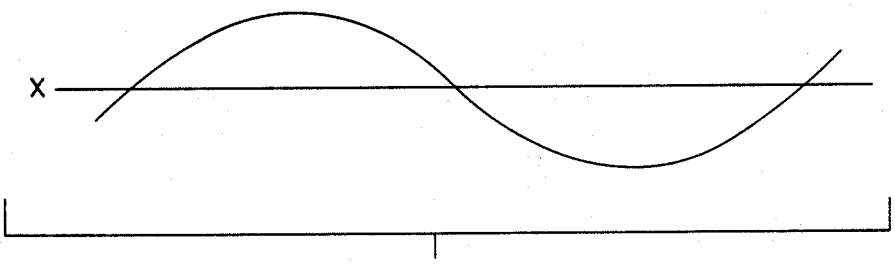
FIG. 3

FIG. 6(a)
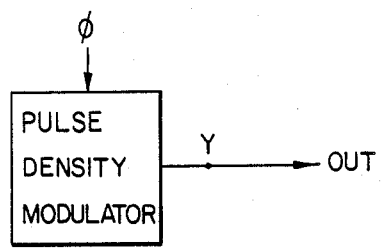
FIG. 6(b)
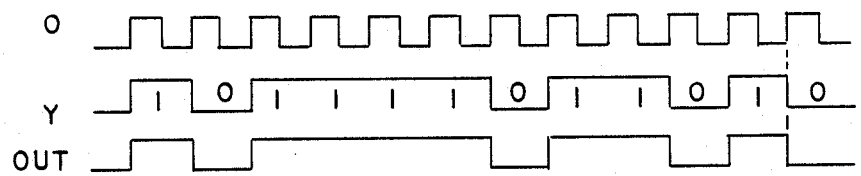
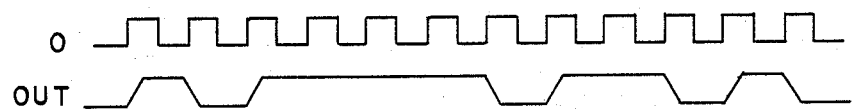
FIG. 6(c)

OVER-
SAMPLING
DIGITAL
FILTER

PULSE
DENSITY
MODU-
LATOR

ANALOG
LOW-
PASS
FILTER

FIG. 15
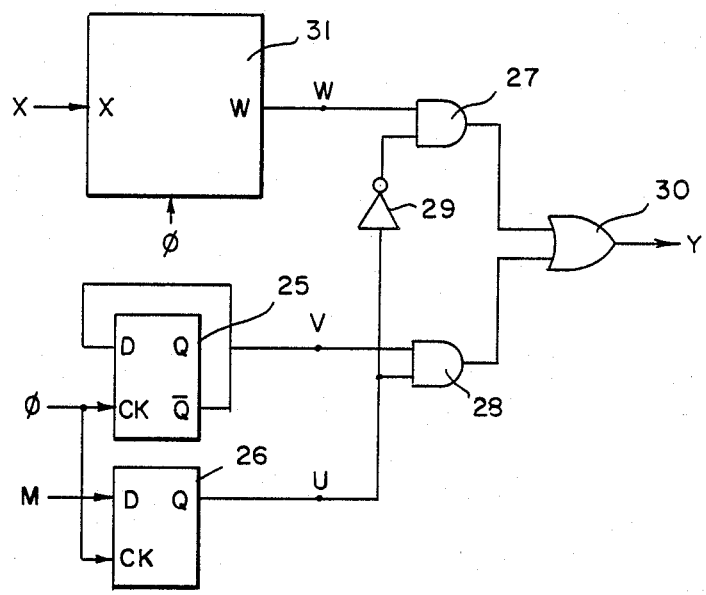
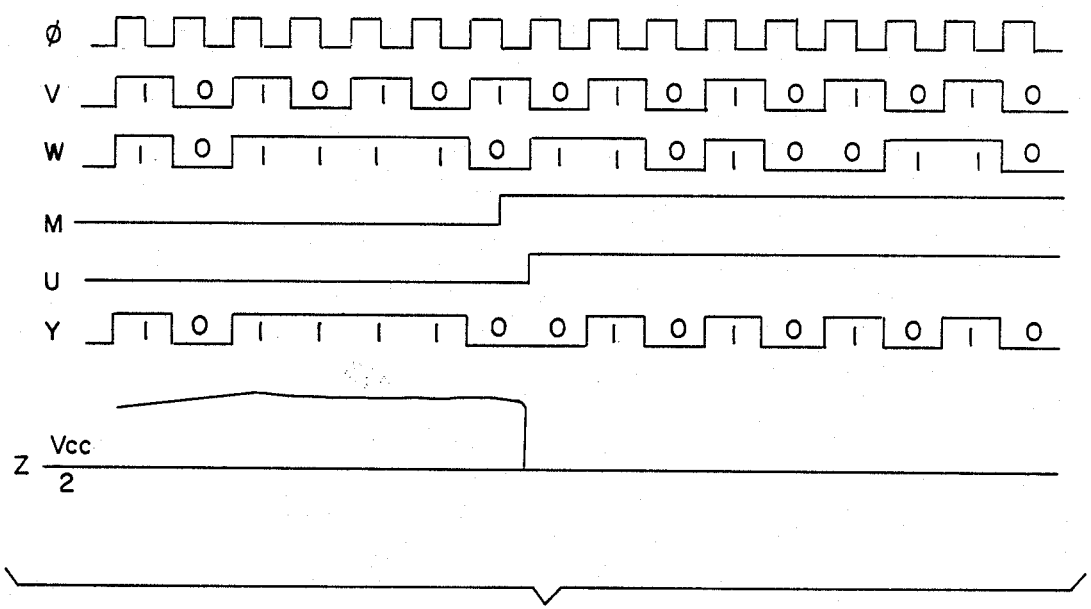
FIG. 16

DIGITAL-TO-ANALOG CONVERTER SYSTEM

BACKGROUND OF THE INVENTION

The present invention relates to a D/A converter system which converts a digital signal to an to analog signal.

The conventional D/A converter system has the following problems. That is, since a high precision analog circuit is required to convert a PCM (Pulse Coded Modulation) signal directly in an analog signal, the D/A converter system is expensive. Besides, since the D/A converter is composed of analog circuits, it is difficult to construct the converter on the same ship as signal-processing digital block. The D/A converter must be constructed on an independent chip.

Conventionally, a pulse width modulation system is popular for the D/A converter composed of digital circuits. However, pulse of different widths have different frequency spectrums. Therefore, when an analog signal is reproduced by pulses with different widths, the difference in the spectrum of the pulses causes noise. It means that an analog signal with a good S/N ratio cannot be obtained by the pulse width modulation system.

SUMMARY OF THE INVENTION

Accordingly, an object of the present invention is to provide a D/A converter system which is applicable to digital audio equipment, communication equipment or measuring equipment and capable of converting digital signal to analog signal satisfactorily.

Another object of the present invention is to provide a D/A converter system which converts digital signal such as PCM signal to pulse density modulation signal and eliminates noise by using an analog low-pass filter before conversion to analog signal.

Another object of the present invention is to provide a D/A converter system in which a pulse density modulation type D/A converter itself has amuting function.

Still another object of the present invention is to provide a D/A converter system which converts PCM signal as digital signal to pulse density modulation signal, subjects the pulse density modulation signal to electro/photo conversion for optical transmission, subjects the transmitted photo signal to photo/electro conversion, and then converts it to analog signal after removing noise by an analog low-pass filter.

Other objects and further scope of applicability of the present invention will become apparent from the detailed description given hereinafter. It should be understood, however, that the detailed description and specific examples, which indicating preferred embodiments of the invention, are given by way of illustration only, since various changes and modifications within the spirit and scope of the invention will become apparent to those skilled in the art from this detailed description.

To achieve the above objects, according to an embodiment of the present invention, a D/A converter system for converting digital signal to analog signal to converts PCM signal to pulse density modulation signal and removes noise by an anlog low-pass filter before conversion to analog signal. The pulse density modulator has higher modulation frequency than the sampling frequency of the PCM signal input, and noise is reduced by noise shaping. An over-sampling digital filter may be added for simplified noise-eliminating analog low-pass filter.

To achieve the above objects, according to another embodiment of the present invention, a D/A converter system for converting digital signal to analog signal contains a pulse density modulator for converting PCM signal input as digital signal to PDM (Pulse Density Modulation) signal and an analog low-pass filter for converting the PDM signal to analog signal. The PDM type D/A converter itself is provided with muting function. The system has means for supplying pulse signal of 50% duty ratio in place of the PDM signal to the analog low-pass filter according to a muting control signal.

To achieve the above objects, according to a further embodiment of the present invention, a D/A converter system comprises a digital processor, an optical transmission section for transmitting photo signal output from the digital processor, and an analog processor, the digital processor comprising a signal processing circuit which processes signal input and outputs it as PCM signal, a pulse density modulator connected to the signal processing circuit so as to convert the PCM signal to PDM signal, and an electro/photo converting circuit for converting the PDM signal to photo signal, the analog processor, comprising a photo/electro converting circuit for converting the transmitted photo signal to PDM signal, and an analog low-pass filter for converting the PDM signal to analog signal.

The present invention is applicable to voice-band D/A converter systems such as digital audio D/A converters and voice synthesizing D/A converters.

The D/A converter system of the present invention is applicable as D/A converter systems for digital audio equipment or high precision measurement equipment which require 90 dB or higher S/N ratio, and it is useful for signal transmission in the digital and analog circuits of equipment which has great disturbance.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIG. 1 is a block diagram of a D/A converter system of the present invention;

FIG. 2 is a circuit diagram of a pulse density modulator circuit incorporating noise shaping of first degree;

FIG. 3 is a waveform chart of a PCM signal input "X" and an analog signal output "Y";

FIGS. 6(a) and 7(a) show the outputs of the pulse density modulator circuits;

FIG. 6(b) is a waveform chart showing the relationship between the pulse density modulation data "Y" and the output "OUT" of FIG. 6(a);

FIGS. 6(c) and 7(c) are waveform charts showing the influence of the rising and falling characteristics of the outputs from the circuits of FIGS. 6(a) and 7(a), respectively;

FIG. 15 is a circuit diagram showing the internal construction of the pulse density modulation type D/A converter of FIG. 10;

FIG. 16 is a waveform chart of the signals in the circuit of FIG. 15;

DETAILED DESCRIPTION OF THE INVENTION

Figure 4:
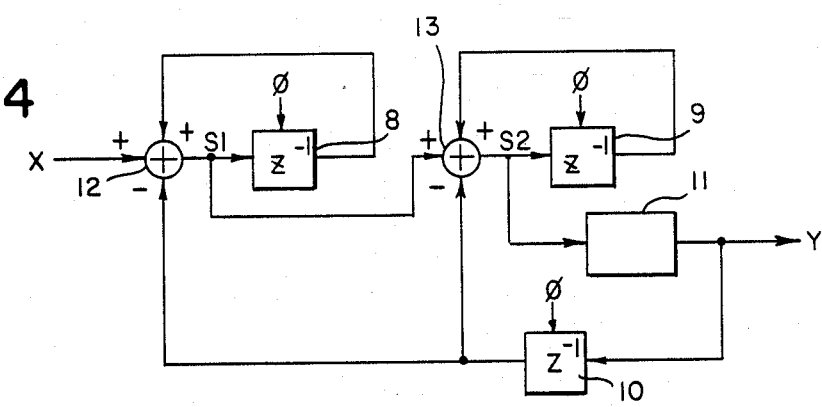
FIGS. 4 and 5 are circuit diagrams of pulse density modulator circuits incorporating noise shaping of second degree.

Now, the present invention is described in detail by using the first embodiment.

FIG. 1 is a block diagram showing the construction of a D/A converter system of the present invention. A PCM (Pulse Coded Modulation) signal "X", a digital signal output from a signal processing circuit which processes an input signal and outputs it as a digital signal, is converted to a pulse density modulation signal "Y" by a pulse density modulator 1, and noise is then removed by an analog lowpass filter 2 to obtain an analog signal "Y".

As shown in FIG. 1, the D/A converter of the present invention comprises a pulse density modulator circuit. To secure a high S/N ratio, the pulse density modulator circuit incorporates noise shaping. The modulation frequency is selected as high as possible and is provided for the pulse density modulation so as to achieve effective noise shaping.

FIG. 2 shows the pulse density modulator circuit which incorporates noise shaping of degree first degree. In the circuit, memories 4 and 5 receive data in synchronization with clocks $\phi$. A positive/negative determination circuit 6 determines if input data is positive or negative, and outputs the result. When the input data is expressed by a 2's complement or offset binary, the determination circuit 6 may only examine the MSB (Most Significant Bit) to determine whether the data is positive or negative. 7 is an adder.

In FIG. 2, "X" is a PCM (Pulse Coded Modulation) signal input as a digital signal and "Y" is a PDM (Pulse Density Modulation) signal output. "S" is data at the point indicated in the figure. The PCM signal input "X" is quantized digital data.

In the circuit shown in FIG. 2, the following equations (1) and (2) hold for "X", "Y" and "S":

$$S = X - Y \cdot Z^{-1} + S \cdot Z^{-1} \tag{1}$$

$$Y = S + N \tag{2}$$

in which $Z^{-1} = \cos \omega T - j \sin \omega T$ $\omega$: Angular velocity of the signal input T: Clock cycle In the equation (2), "N" is a noise generated by quantizing "S" to one bit, namely the difference between "Y" and "S".

Eliminating "S" from the equations (1) and (2), we obtain $$Y = X + N(1 - Z^{-1}) \tag{3}$$

According to the equation (3), when $\omega T$ or the frequency of the signal input is small or when the clock cycle "T" is short, "$Z^{-1}$" is close to "1". Therefore, $1 - Z^{-1} \approx 0$. In the equation (3), if $1 - Z^{-1} \approx 0$, then $Y \approx X$. "X" is the input data of two or more bit length, and "Y" is a one bit data. It is appreciated that the pulse density modulator circuit with noise shaping function can attain satisfactory S/N ratio even when the output data is of one bit or a pulse density modulation signal.

FIG. 3 shows the relationship between the input "X" and the output "Y". As understood, the output pulse density increases as the input data level is higher.

With the higher degree, noise component can be decreased more effectively by noise shaping.

Figure 5:
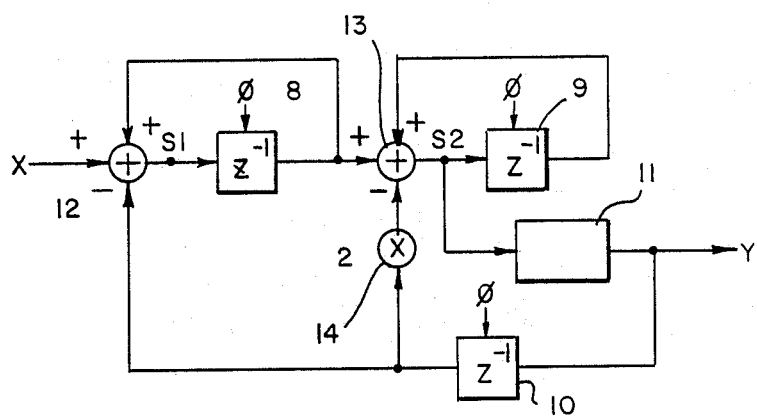

FIGS. 4 and 5 show the pulse density modulator circuits incorporating noise shaping of second degree. Referring to these figures, "X" is a PCM signal input and "Y" is a PDM signal output. "$S_1$" and "$S_2$" are data at the points indicated in the circuits of FIGS. 4 and 5.

Referring to FIGS. 4 and 5, memories 8, 9 and 10 receive data in synchronization with clocks $\phi$. A positive/negative determination circuit 11 determines if the input data is positive or negative and outputs the result. 12 and 13 are adders. 14 of FIG. 5 is a multiplier circuit.

In the circuit of FIG. 4, the following equations hold:

$$X + S_1 \cdot Z^{-1} - Y \cdot Z^{-1} = S_1 \tag{4}$$

$$S_1 + S_2 \cdot Z^{-1} - Y \cdot Z^{-1} = S_2 \tag{5}$$

$$Y = S_2 + N \tag{6}$$

in which $Z^{-1} = \cos \omega T - j \sin \omega T$ $\omega$: Angular velocity of the signal input T: Clock cycle Similar to the equation (2), "N" of the equation (6) is a noise generated due to quantization.

Eliminating "$S_1$" and "$S_2$" from the equations (4), (5) and (6), we obtain $$Y = X + N(1 - ^{-1})^2 \tag{7}$$

In the circuit of FIG. 5, the following equations hold:

$$X + S_1 \cdot Z^{-1} - Y \cdot Z^{-1} = S_1 \tag{8}$$

$$S_1 \cdot Z^{-1} + S_2 \cdot Z^{-1} - 2Y \cdot Z^{-1} = S_2 \tag{9}$$

$$Y = S_2 + N \tag{10}$$

in which $Z^{-1} = e^{-j\omega T} = \cos \omega T - j \sin \omega T$ $\omega$: Angular velocity of the signal input T: Clock cycle Similar to the equation (2), "N" of the equation (10) is a noise due to quantization (noise generated in quantization to one bit).

Eliminating "$S_1$" and "$S_2$" from the equations (8), (9) and (10), we obtain $$Y = Z^{-1} \cdot X + N(1 - Z^{-1})^2 \quad (11)$$

From the equation (11), we have $$Y - X \cdot Z^{-1} = N(1 - Z^{-1})^2 \quad (12)$$

Noise distribution can be found by obtaining the absolute value from the equation (12) as follows:

$$\begin{aligned} |Y - X \cdot Z^{-1}| &= |N \cdot (1 - Z^{-1})^2| \\ &= |N| \cdot |(1 - \cos\omega T + j\sin\omega T)|^2 \\ &= 2 \cdot |N| \cdot (1 - \cos\omega T) \end{aligned} \quad (13)$$

The equations (7) and (11) contain $N(1-Z^{-1})^2$ whereas the equation (3) contains $N(1-Z^{-1})$. Since $1-Z^{-1} \approx 0$, noise component is smaller in the former equations than in the latter equation.

The difference between the equations (7) and (11) is a coefficient "$Z^{-1}$" of "X" in the equation (11). This coefficient indicates the delay by "T" (the cycle of clock $\phi$) and has no influence on noise component and frequency characteristics. This means that the output "Y" has a delay by "T", compared to the input "X", which delay does not have any influence on the S/N ratio of pulse density modulation signal output.

Figure 9:
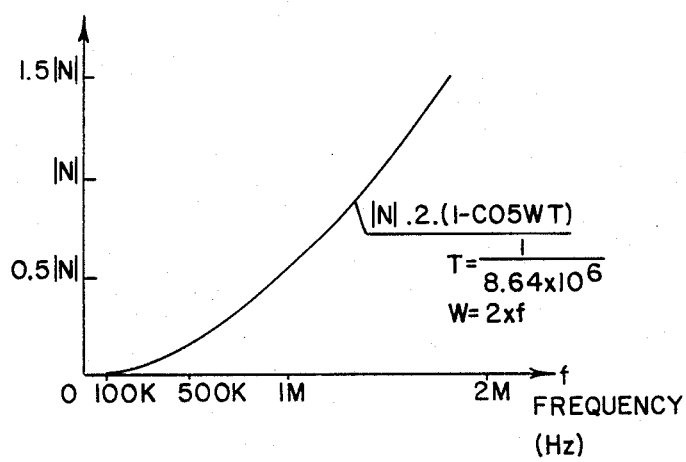
FIG. 9 is a PCM noise distribution graph for explaining the operation of the pulse density modulator circuit of FIG. 5.

The term $N(1-Z^{-1})^2$ is the noise component. In a low frequency region, $N(1-Z^{-1})^2 \approx 0$. Therefore, the equations (11) and (13) indicate models with very good S/N ratio in a low frequency region. (Refer to FIG. 9.)

In the equations (3), (7) and (11) which show relationship between input and output, the noise component is expressed as $N(1-Z^{-1})^n$ in which "n" is the degree of noise shaping; n=1 for first degree, n=2 for second degree and n=3 for third degree of noise shaping.

With larger "n", the noise component decreases but the volume of the pulse density modulator circuit increases. The D/A converter is subjected to the most severe conditions when it is applied to digital audio equipment. It has been known through simulation that, using noise shaping of second degree as shown in FIG. 5, the pulse density modulator circuit can achieve 90 dB or higher S/N ratio in 0~20 KHz audio band if $\phi = 8 \sim 9$ MHz. It is obvious, therefore, that the pulse density modulator with the second degree noise shaping circuit can serve as a D/A converter having good S/N ratio.

Thus, a high accuracy digital audio D/A converter can be realized by using the simple circuits as shown in FIGS. 4 and 5.

Here, comparison is made between the circuits of FIGS. 4 and 5. At a glance, the circuit of FIG. 5 looks more complicated than that of FIG. 4. Actually, however, this is not true. In the circuit of FIG. 4, the output of the adder 12 directly enters the input of the adder 13. The adder 12 operates and outputs the result to the adder 13, and then the adder 13 carries out operation. All these operations must be completed within the cycle "T" of the clock $\phi$. Supposing the clock $\phi$ has a frequency of 8~9 MHz, the cycle "T" is about 100 nsec. If the bit of the input data "X" is long, fast adders must be used for the adders 12 and 13 so as to complete operations by the adders 12 and 13 within the period "T". In the circuit of FIG. 5, in contrast, a memory 8 is connected between the adders 12 and 13, so that each of the adders 12 and 13 takes the period "T" for completing one addition. Accordingly, the adders in FIG. 5 may be slower than those in FIG. 4.

Figure 7A:
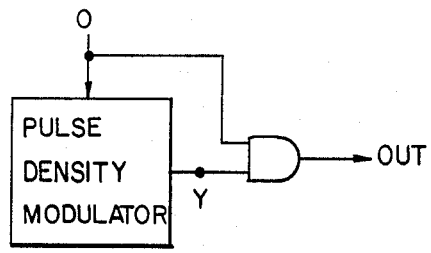
Figure 7B:
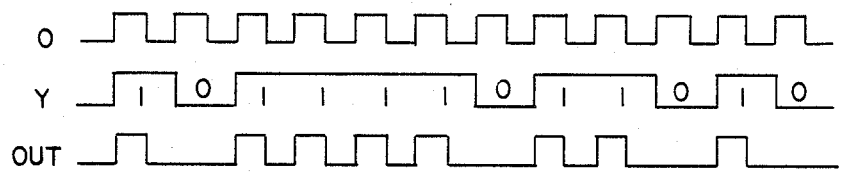
FIG. 7(b) is a waveform chart showing the relationship between the pulse density modulation data "Y" and the output "OUT" of FIG. 7(a)
Figure 7C:

FIGS. 6(a) and 7(a) show the outputs of the pulse density modulator circuits. The pulse density modulator circuit of FIG. 6(a) outputs PDM data directly as it is. The relation between the PDM data "Y" and the output "OUT" of FIG. 6(a) is shown in FIG. 6(b). The pulse density modulator circuit of FIG. 7(a) outputs PDM data as independent pulses. The relation between the PDM data "Y" and the output "OUT" of FIG. 7(a) is shown in FIG. 7(b). FIGS. 6(c) and 7(c) show the influence of the rising and falling characteristics of the outputs from the circuits of FIGS. 6(a) and 7(a), respectively. In the waveforms of FIGS. 6(b) and 7(b), it is assumed that both rising time and falling time are zero. Since rising and falling times are not zero in actual operation, however, the resulting waveforms have slopes as shown in FIGS. 6(c) and 7(c). In FIG. 6(c), continuous output of "1" and discontinuous output of "1" have different power output which causes noise. In FIG. 7(c), on the other hand, the power output for the output "1" is constant at all times. As long as the falling and rising periods are within the range having no influence on adjacent pulses, noises are not generated even if the rising and falling times are not zero.

Now, comparison is made between the circuits of FIGS. 6(a) and 7(a) with respect to power output. The power output of the circuit of FIG. 6(a) doubles that of the circuit of FIG. 7(a). Therefore, the circuit of FIG. 7(a) may be used when better S/N ratio is required, while the circuit of FIG. 6(a) may be used when higher power output is required.

Figure 8:
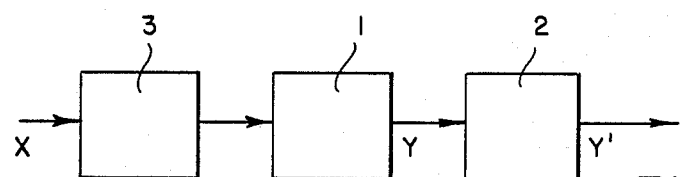
FIG. 8 is a block diagram of another embodiment of a D/A converter system of the present invention.

The PDM signal "OUT" can be converted to analog signal simply by passing it through a low-pass filter. The noise-eliminating analog low-pass filter 2 can be simplified by adding an over-sampling digital filter 3 as shown in FIG. 8.

As understood from the above, the D/A converter of the present invention is constructed using digital circuits alone and therefore can be built on the same chip as the signal processing digital block. Since the output is in the form of pulses, it has two levels: high and low levels. Unlike the D/A converter with resistance ladder, the precision of the elements does not influence the accuracy of the D/A converter. Moreover, unlike the pulse width modulation type D/A converter, the pulse width of the D/A converter of the present invention can be constant, so that it is possible to reproduce analog signal with good S/N ratio.

A D/A converter system of a second embodiment of the present invention is described now. In the second embodiment, muting function is added to the pulse density modulation type D/A converter itself.

Figure 10:
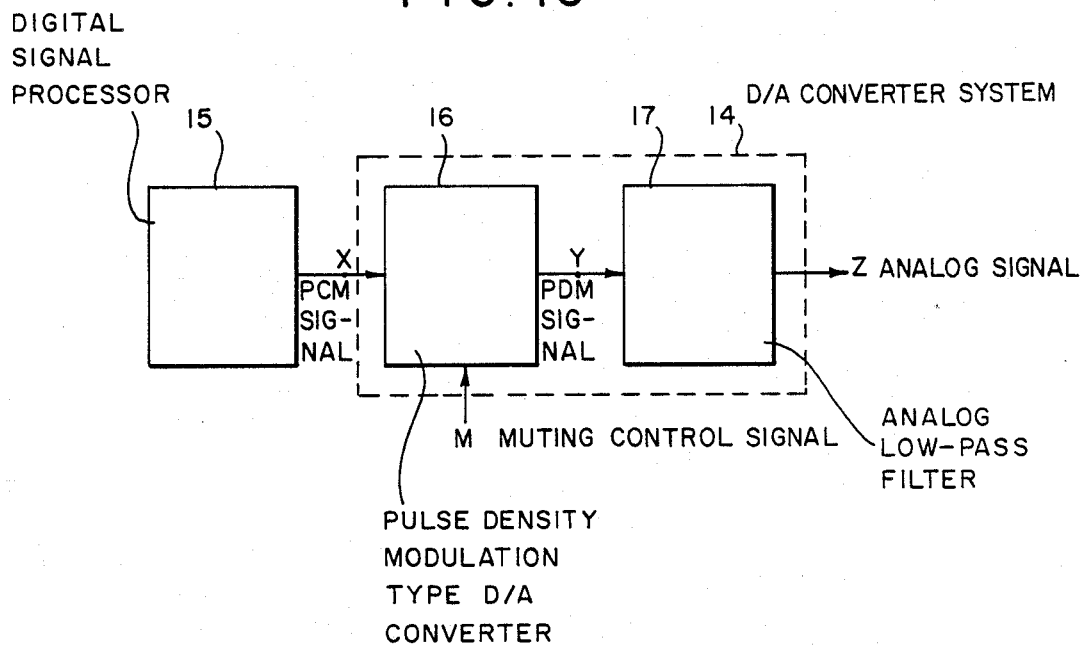
FIG. 10 is a block diagram of another embodiment of a D/A converter system of the present invention.

As shown in FIG. 10, the D/A converter system 14 of the second embodiment of the present invention comprises a pulse density modulation type D/A converter 16 for converting PCM signal "X" supplied as digital signal from a digital signal processor 15 to PDM signal "Y", and an analog low-pass filter 17 for converting the PDM signal "Y" to analog signal "Z". The pulse density modulation type D/A converter 16 incorporates circuit means which, according to a muting control signal "M", supplies pulse signal of about 50% duty in place of PDM signal to the analog low-pass filter 17.

The pulse density modulation type D/A converter 16 contains a pulse density modulator 31 (FIG. 15) which is virtually the same as the one shown in FIG. 5.

Figure 11:
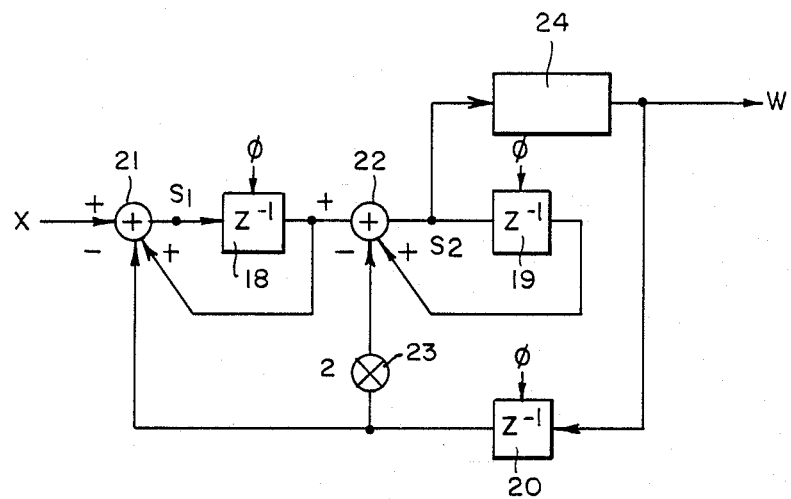
FIG. 11 is a circuit diagram of a pulse density modulator used in the D/A converter system of FIG. 10.

FIG. 11 shows an example of the internal circuit construction of the pulse density modulator. Delay circuits (D latch) 18, 19 and 20 receive data in synchronization with clocks $\phi$. 21 and 22 are adders, and 23 is a multiplier. A comparator 24 outputs "0" or "1" depending whether the result from the adder 22 is positive or negative. "X" is a 16-bit PCM signal input and "W" is a one-bit PDM signal output.

Figure 12:
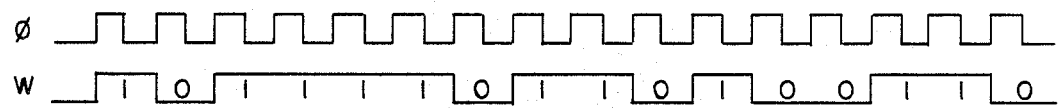
FIG. 12 is a waveform chart of a PDM signal output from the pulse density modulator of FIG. 11.

FIG. 12 shows the waveform of an example of the PDM signal output "W". When being passed through the analog low-pass filter, the PDM signal is converted to the analog signal "Z". (See FIG. 13.)

IF a pulse signal of about 50% duty passes through the analog low-pass filter, voltage becomes $V_{cc}/2$ (medium potential) which is equivalent to muting voltage.

FIG. 15 shows the internal circuit construction of the pulse density modulation D/A converter 16 of FIG. 10. 31 is the pulse density modulator, 25 and 26 are D latches, 27 and 28 are AND gates, 29 is an inverter, and 30 is an OR gate. "M" is a muting control signal according to which the output "Y" selects audio band signal state or muting state.

When the muting control signal "M" is at L (low) level, the output "U" of the D latch 26 is at L level. Then, the AND gate 27 is effective so that the PDM signal "W" from the pulse density modulator 31 is output to the output "Y" through the AND gate 27 and the OR gate 30. The PDM signal is then converted to an analog signal by the subsequent analog low-pass filter 17.

When the muting control signal "M" is at H (high) level, the output "U" of the D latch 26 becomes H level in synchronization with a clock $\phi$. Accordingly, the AND gate 27 becomes ineffective and simultaneously the AND gate 28 becomes effective. Consequently, the PDM signal "W" is inhibited from being output from the pulse density modulator 31, while the muting signal "V" from the D latch 25 is allowed to be output through the AND gate 28 and the OR gate 30 to the output "Y". The muting signal "V" is a pulse signal of about 50% duty whose frequency is a half that of the clock $\phi$. The pulse signal output is then passed through the subsequent analog low-pass filter 17 to be converted to a muting voltage. Muting is thus carried out.

When the muting control signal "M" changes over to L level again, the output "U" of the D latch 26 also changes to L level in synchronization with a clock $\phi$, terminating the muting operation.

FIG. 16 shows waveform of each signal.

In the above embodiment, the muting signal of about 50% duty is obtained by dividing the frequency of the clock $\phi$ by two by the D latch. The frequency of the muting signal is not limited to that in the above embodiment. The signal may by of any frequency if it is a pulse signal of about 50% duty.

A D/A converter system of a third embodiment of the present invention is now described. The D/A converter system of the third embodiment converts digital signal such as PCM signal to PDM (Pulse Density Modulation) signal, subjects the PDM signal to electro-/photo conversion for optical transmission, converts the photo signal to an electric signal, removes noise by an analog low-pass filter and then converts the electric signal to an analog signal.

Figure 17:
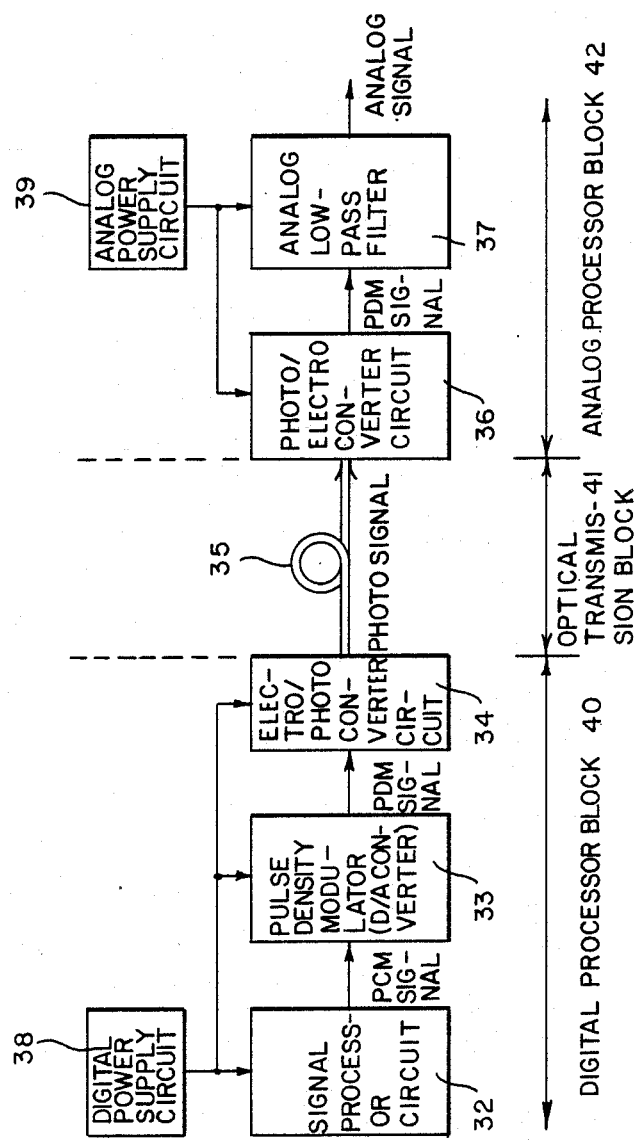
FIG. 17 is a block diagram of another embodiment of a D/A converter system of the present invention.

FIG. 17 is a block diagram showing the basic construction of the D/A converter system of the third embodiment. As shown, the D/A converter system comprises a digital processor block 40 and an analog processor block 42 connected through an optical transmission section 41 to the digital processor block 40. The digital processor block 40 comprises a signal processor circuit 32 which processes a signal input and outputs it as a PCM signal, a pulse density modulator 33 for converting the PCM signal to a PDM signal, and an electro/photo converter circuit 34 which converts the PDM signal to a photo signal. The analog processor block 42 comprises a photo/electro converter circuit 36 for converting the photo signal to a PDM signal and an analog low-pass filter 37 which converts the PDM signal to an analog signal.

38 is a digital power supply circuit, 35 is a photo signal transmission medium and 39 is an analog power supply circuit.

The invention is described with reference to FIG. 19 which shows the construction further in detail. A PCM signal from the signal processor circuit 32 is input to the pulse density modulator 33 (a PDM type D/A converter) which converts the PCM signal to a PDM signal. By using a clock $\phi$, an AND gate (see FIG. 18) takes the logical product from the PDM signal and outputs it to a fast LED driver circuit 51. Th logical level of the input is the C-MOS level. That is, a fast LED 52 is driven by the PDM signal so as to convert electric pulse to optical pulse.

Figure 18:
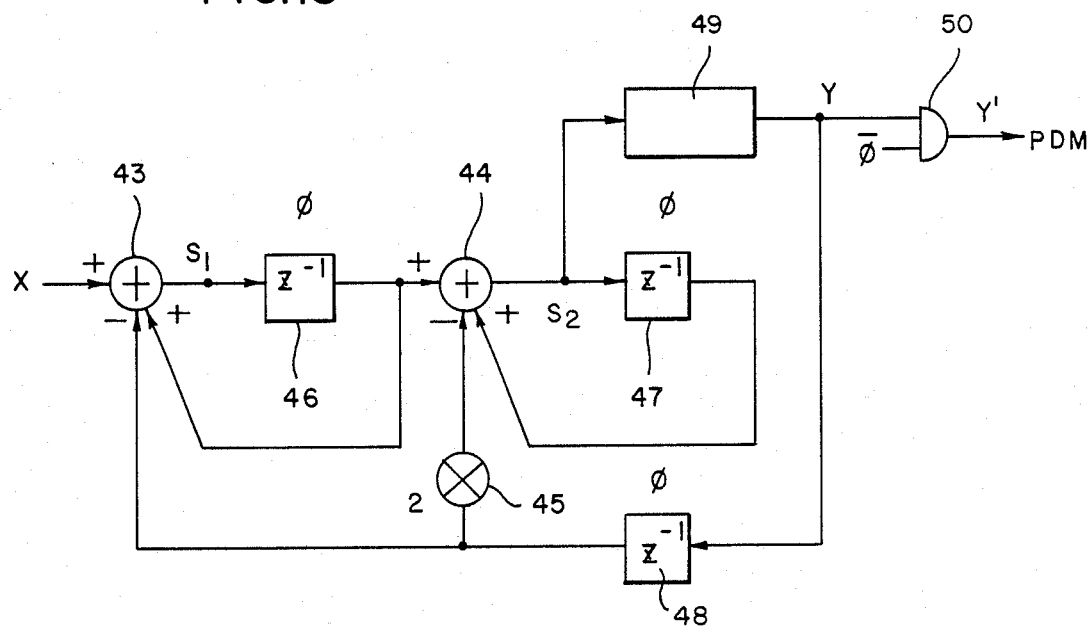
FIG. 18 is a circuit diagram of the pulse density modulator used in the D/A converter system of FIG. 17.

The pulse density modulator used in the third embodiment is almost identical as the one shown in FIG. 5, as shown in FIG. 18.

Referring to FIG. 18, 46, 47 and 48 are delay circuits (D latches) which receive data in synchronization with clocks $\phi$. 49 is a comparator which determines in the quantized digital PCM signal "X" is positive or negative and outputs the result. 43 and 44 are adders and 45 is a multiplier.

The analog processor block 42 is connected via the optical fiber 35 to the digital processor block 40 of the above circuit construction. Therefore, optical pulse sent from the digital processor block 40 is transmitted through the optical fiber 35 to be led into a fast photo sensor device 53 (such as photo diode) of the photo sensor circuit whereby the optical pulse is converted to electric pulse. The electric pulse is amplified by the amplifier circuit in the photo sensor circuit and wave-shaped by a wave shaping circuit 54 so that PDM signal is reproduced. At this time, the output from the wave shaping circuit 54 is at C-MOS level.

The PDM signal is passed through analog low-pass filters 37 to cut high frequency and remove reflected noise, respectively, and then through an analog amplifier 55, so as to reproduce analog signal with high S/N ratio free from influence by noise of the digital processor block 40.

The present system which is intended for use in digital audio equipment needs to reproduce signals for two channels: left and right channels, and therefore requires two each of the pulse density modulators 33, fast LED drivers 51, fast LED 52, optical fibers 35, fast photo sensor device 53, wave shaping circuits 54, analog low-pass filters 37 made up of resistors and capacitors, and analog amplifiers 55.

Thus, according to the present invention, the analog circuit 42 is completely separated from the digital circuit 40, so that the signal with high S/N ratio (96 dB) obtained in the PDM type D/A converter 33 is directly reproduced as an analog signal without being affected by the noise of the digital circuit. Besides, according to the present invention, the system involves only two transmission media (such as optical fiber) for L-CH and R-CH and therefore can attain substantial cost reduction compared with the conventional system.

Figure 13:
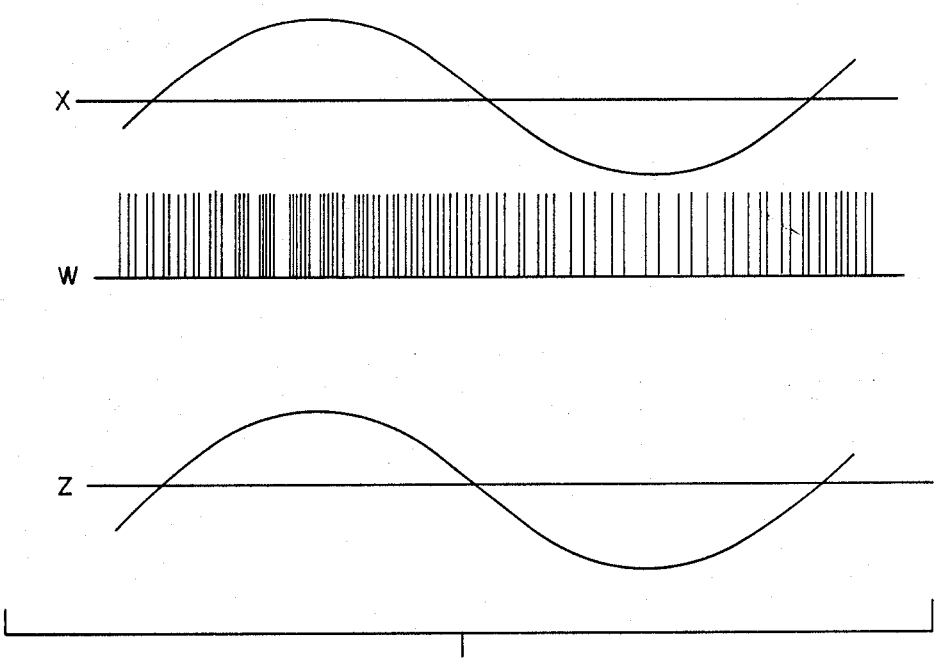
FIG. 13 is a waveform chart showing PCM signal "X", PDM signal "W" and analog signal "Z" of the D/A converter system of FIG. 10.
Figure 14:
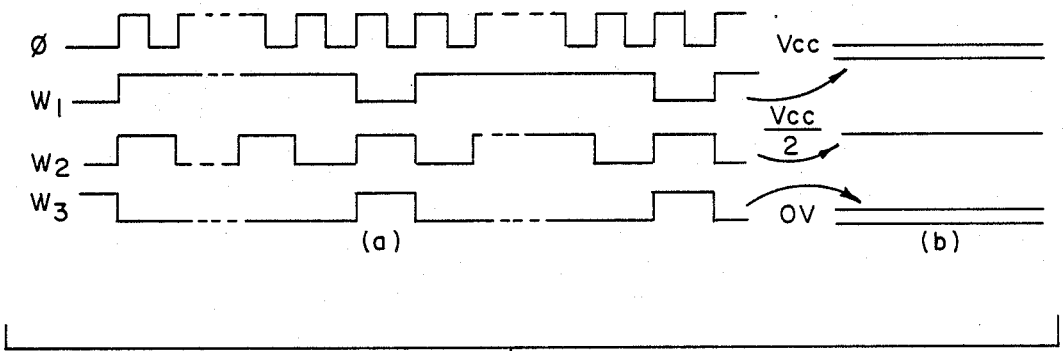
FIG. 14 is a waveform chart showing the potential of the signal output from the pulse density modulator of FIG. 11 when it passes the analog low-pass filter.
Figure 20:
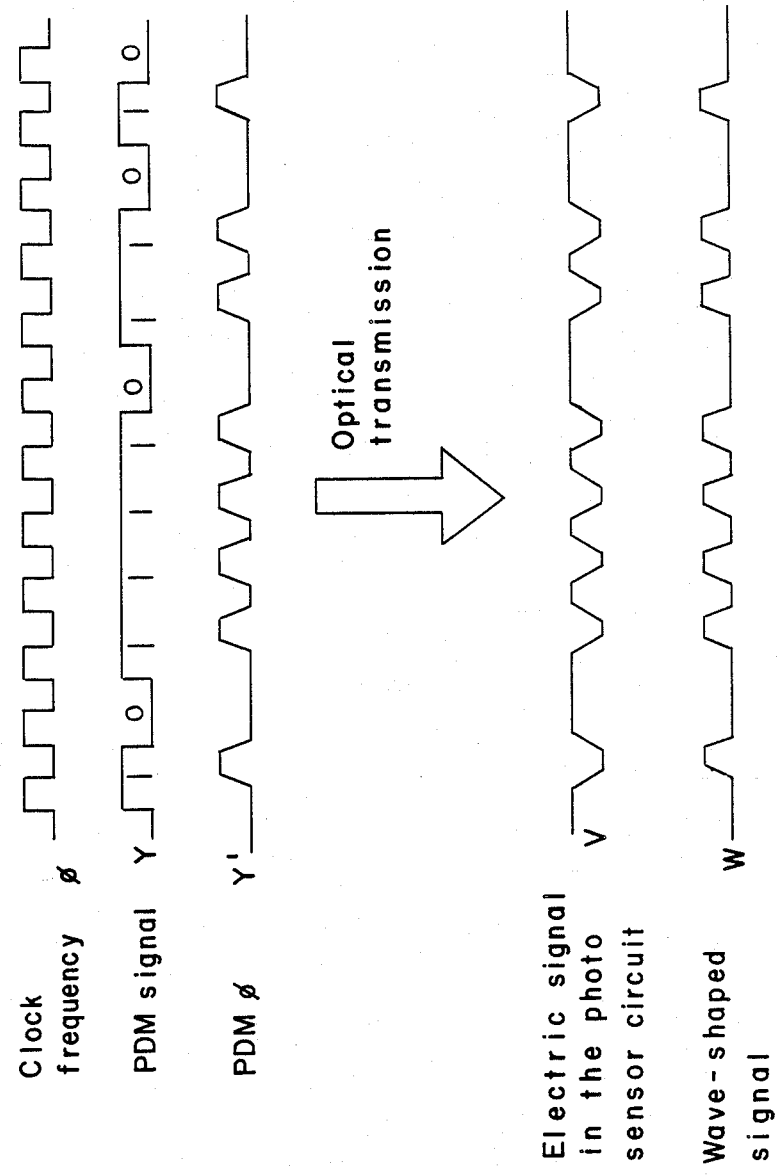
FIG. 20 is a waveform chart showing the transmission timing for the PDM signal.

Optical fiber is used as the photo transmission medium in the above embodiment. Alternatively, optical isolator, photo coupler or the like medium which conducts transmission by light may be used. FIG. 13 shows the relationship among the PCM signal "X", PDM signal "Y" and analog signal "Z" in the present system. FIG. 20 shows transmission timing for the PDM.

Figure 19:
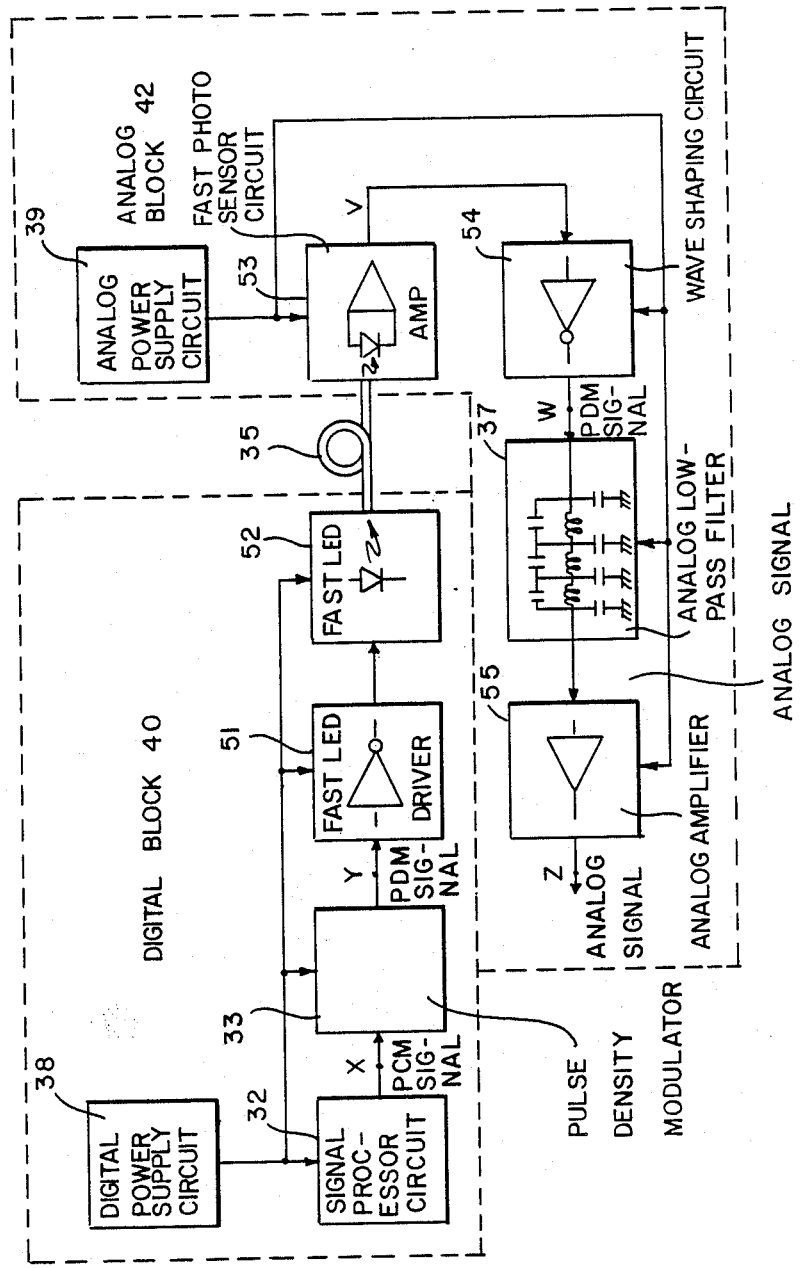
FIG. 19 is a circuit diagram of the D/A converter system of FIG. 17.

An analog low-pass filter shown in FIG. 19 may be used in the present invention.

Theoretically, the modulation frequency of the pulse density modulator of the present invention should be as high as possible to obtain better characteristics. In practice, however, considering the operation speed of the present IC circuit, modulation frequency of about 4 MHz~10 MHz is sufficient enough to obtain optimal characteristics.

Figure 21:
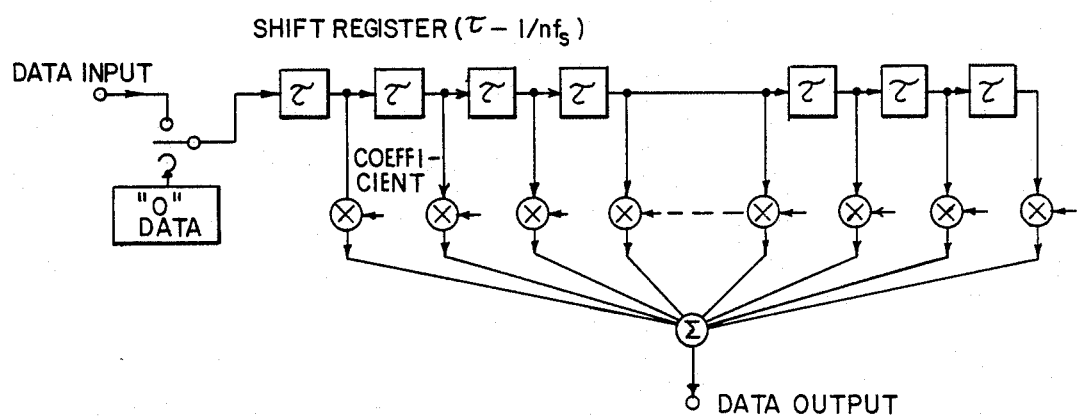
FIG. 21 is a circuit diagram of the over-sampling digital filter shown in FIG. 8.

The over-sampling digital filter 3 shown in FIG. 8 may have the circuit construction shown in FIG. 21. This filter converts the sampling frequency by a factor of "n" (n=2 or 4 in general) through pure digital processing. According to the type of impulse response, the circuit system of the filter is classified into IIR (Infinite Impulse Response) filter and FIR (Finite Impulse Response) filter. The FIR filter is shown in FIG. 21. As shown, the FIR filter comprises shift registers connected in series, multipliers for multiplying the digital data of each tap by a coefficient, and an adder for summing up the multiplied results for the entire taps. The coefficients are stored as ROM data.

Digital data is input from the left to the series of shift registers. The sampling frequency is equivalently converted by a factor of "n" (over-sampling) by inserting "0" of the quantity of (n−1) between the transmitted reproduced data.

As appreciated from the above, the present invention has the following advantageous effects.

1. The conventional high accuracy D/A converter uses the bipolar process and is built on an independent chip. The D/A converter of the present invention can be composed of digital circuits without sacrificing the high accuracy, and therefore can use MOS process.

2. Since a signal processor is generally composed of a digital circuit, the D/A converter of the present invention can be built on the same chip as the signal processor. Namely, the signal processor and the D/A converter can be built on one chip.

3. The present invention does not rely on a signal processing IC or a micro computer for its muting function, so it can be accommodated for systems of any type. It is easy to mute the D/A converter.

4. External switches are not required, which helps realize a D/A converter system of low cost and being free from noise.

5. Since muting is carried out at the last stage of the D/A converter, muting performance can be enhanced.

6. Since the analog circuit susceptible to noise can be completely separated from the noise-generating digital circuit, signal of high S/N ratio is obtained.

7. Since the digital circuit and the analog circuit are interconnected via one optical fiber cable, the cost of the system of the present invention can be substantially reduced compared to that of the conventional system.

8. Since signal is transmitted through the optical fiber, the signal is not deformed by the extension of the cable and free from influence by external noise.

9. It is not necessary to consider EMI in long distance transmission of the output of the D/A converter.

While only certain embodiments of the present invention have been described, it will be apparent to those skilled in the art that various changes and modifications may be made therein without departing from the spirit and scope of the present invention as claimed:

What is claimed is:

1. A D/A converter system for converting a digital signal to an analog signal, comprising:
   means for a receiving PCM (Pulse Coded Modulation) signal as a digital signal;
   pulse density modulator means for converting the PCM signal received by said receiving means to a pulse density modulation signal; and
   means for converting the pulse density modulation signal output from said pulse density modulator means to an analog signal;
   said pulse density modulator means including,
     a first memory having a first memory input and a first memory output;
     a first adder adding said PCM signal and said first memory output and developing a first adder output, said first adder output being connected to said first memory input;
     a second memory having a second memory input and a second memory output;
     a second adder adding said first memory output and said second memory output and developing a second adder output, said second adder output being connected to said second memory input; and
     positive/negative determination means, connected to the said second adder output, for developing said pulse density modulation signal related to the signal of said second adder output.

2. The D/A converter of claim 1 wherein said pulse density modulator means further includes,
   a third memory having a third memory input connected to said pulse density modulation signal and developing a third memory output,
   said first adder subtracting said third memory output from the sum of said PCM signal and said first memory output, and
   a multiplier connected to said third memory output and developing a multiplier output,
   said second adder subtracting said multiplier output from the sum of said first memory output and said second memory output.

3. The D/A converter system of claim 1, wherein said means for converting the pulse density modulation signal to the analog signal is an analog low-pass filter.

4. The D/A converter system of claim 1, further comprising:
   means for supplying a muting control signal;
   mute means, responsive to said muting control signal, for selectively converting the pulse density modulation signal output from said pulse density modulator means to a pulse signal of a preselected duty representative of a zero analog voltage level; and means for supplying said analog low-pass filter with said pulse signal of a preselected duty as an output of said pulse density modulator means.

5. The D/A converter system of claim 1, further comprising:

electro/photo converter means for converting the pulse density modulation signal output of said pulse density modulator means to a photo signal;

an optical transmission medium for transmitting the photo signal from said electro/photo converter means; and photo/electro converter means for converting the photo signal transmitted through said optical transmission medium back into the pulse density modulation signal output from said pulse density modulator means to thereby isolate said means for converting from electrical noise developed by said pulse density modulator means.

6. The D/A converter system of claim 1, wherein said analog low-pass filter is supplied with the pulse density modulation signal when the muting control signal is at a low level, and with the pulse signal of a preselected duty when the muting control signal is at a high level.

* * * * *